(12) United States Patent
Wei et al.

(10) Patent No.: US 11,862,113 B2
(45) Date of Patent: Jan. 2, 2024

(54) DISPLAY PANEL AND ELECTRONIC DEVICE

(71) Applicant: CHONGQING KONKA PHOTOELECTRIC TECHNOLOGY RESEARCH INSTITUTE CO., LTD., Chongqing (CN)

(72) Inventors: Xiaojiao Wei, Chongqing (CN); Shan-Fu Yuan, Chongqing (CN); Liu-Chung Lee, Chongqing (CN); Tzu-Ping Lin, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 0 days.

(21) Appl. No.: 17/436,069

(22) PCT Filed: Aug. 13, 2020

(86) PCT No.: PCT/CN2020/109003
§ 371 (c)(1),
(2) Date: Sep. 2, 2021

(87) PCT Pub. No.: WO2022/032590
PCT Pub. Date: Feb. 17, 2022

(65) Prior Publication Data
US 2023/0162694 A1    May 25, 2023

(51) Int. Cl.
*G09G 3/34* (2006.01)
*G09G 3/36* (2006.01)
*H01L 25/16* (2023.01)

(52) U.S. Cl.
CPC ............. *G09G 3/3406* (2013.01); *G09G 3/36* (2013.01); *H01L 25/167* (2013.01);
(Continued)

(58) Field of Classification Search
CPC .................. G09G 3/3406; G09G 3/36; G09G 2300/0426; G09G 2300/0452;
(Continued)

(56) References Cited

U.S. PATENT DOCUMENTS 7,453,429 B2 * 11/2008 Chang .................. G09G 3/3648
345/89
8,031,273 B2 * 10/2011 Yabuta .................. G06F 3/0412
349/1
(Continued)

FOREIGN PATENT DOCUMENTS

CN          104122705 A      10/2014
CN          104851394 A       8/2015
(Continued)

OTHER PUBLICATIONS

International Search Report for corresponding application PCT/CN2020/109003 filed Aug. 13, 2020; dated May 12, 2021.
(Continued)

*Primary Examiner* — Benyam Ketema
(74) *Attorney, Agent, or Firm* — Gang Yu

(57) ABSTRACT

The present disclosure relates to a display panel and an electronic device. The display panel includes a driving array; first light-emitting deices electrically connected with the driving array; and second light-emitting devices located between at least two of the first light-emitting devices and electrically connected with the driving array. In a case where the first light-emitting devices are in a working state and the second light-emitting devices are in a first state, the display panel is in a first mode; and in a case where the first light-emitting devices are in a working state and the second light-emitting devices are in a second state, the display panel is in a second mode, wherein a visual angle of the display (Continued)

panel in the first mode is greater than 0 and smaller than a visual angle of the display panel in the second mode.

18 Claims, 5 Drawing Sheets

(52) U.S. Cl.
CPC ............ *G09G 2300/0426* (2013.01); *G09G 2300/0452* (2013.01); *G09G 2320/068* (2013.01); *G09G 2320/0626* (2013.01); *G09G 2358/00* (2013.01)

(58) Field of Classification Search
CPC ..... G09G 2320/0626; G09G 2320/068; G09G 2358/00
See application file for complete search history.

(56) References Cited

U.S. PATENT DOCUMENTS

| | | | |
|---|---|---|---|
| 10,192,475 B2* | 1/2019 | Ju | G09G 3/20 |
| 2002/0145687 A1* | 10/2002 | Mitsui | G02F 1/133621 |
| | | | 349/113 |
| 2004/0124781 A1* | 7/2004 | Bae | H10K 59/88 |
| | | | 315/169.3 |
| 2004/0125298 A1* | 7/2004 | Oh | G02F 1/13471 |
| | | | 349/129 |
| 2004/0195574 A1* | 10/2004 | Ahn | G02F 1/13458 |
| | | | 438/152 |
| 2004/0207594 A1* | 10/2004 | Kubo | G02F 1/1323 |
| | | | 345/100 |
| 2006/0139548 A1* | 6/2006 | Ahn | G02F 1/134363 |
| | | | 349/141 |
| 2007/0040975 A1* | 2/2007 | Momoi | G02F 1/133753 |
| | | | 349/129 |
| 2007/0146261 A1* | 6/2007 | Matsushima | G09G 3/3688 |
| | | | 345/87 |
| 2007/0152932 A1* | 7/2007 | Chung | G09G 5/02 |
| | | | 345/88 |
| 2009/0033596 A1* | 2/2009 | Yoon | H10K 59/12 |
| | | | 345/76 |
| 2012/0133612 A1 | 5/2012 | Wang et al. | |
| 2015/0346417 A1* | 12/2015 | Powell | G02B 6/0051 |
| | | | 362/606 |
| 2016/0357046 A1 | 12/2016 | Choi et al. | |
| 2017/0131832 A1* | 5/2017 | Lee | G06F 3/0412 |
| 2017/0316736 A1 | 11/2017 | Hughes et al. | |
| 2023/0043726 A1* | 2/2023 | Xiao | H01L 25/167 |

FOREIGN PATENT DOCUMENTS

| | | | |
|---|---|---|---|
| CN | 106054454 A | 10/2016 | |
| CN | 106405915 A | 2/2017 | |
| CN | 207663770 | * 7/2017 | ............... G09G 3/34 |
| CN | 107768411 A | 3/2018 | |
| CN | 108037600 A | 5/2018 | |
| CN | 108196406 A | 6/2018 | |
| CN | 207663770 U | 7/2018 | |
| CN | 108519668 A | 9/2018 | |
| CN | 108646493 A | 10/2018 | |
| CN | 108828837 A | 11/2018 | |
| CN | 108897169 A | 11/2018 | |
| CN | 109920344 A | 6/2019 | |
| CN | 110600518 A | 12/2019 | |
| CN | 209821548 U | 12/2019 | |
| CN | 111290115 A | 6/2020 | |
| KR | 20070058256 A | 6/2007 | |
| KR | 20180009867 A | 1/2018 | |
| KR | 20190036936 A | 4/2019 | |
| WO | WO-2017193328 A1 * | 11/2017 | |
| WO | 2020062751 A1 | 4/2020 | |

OTHER PUBLICATIONS

Leng Jinbi et al. "Viewing angle changeable display". 5th International Symposium on Advanced Optical Manufacturing and Testing Technologies-Optoelectronic Materials and Devices for Detector, Imager, Display, and Energy Conversion Technology. Oct. 22, 2010 (Oct. 22, 2010). vol. 7658, p. 765816.

Chen, Yinwei et al. "Research of dual cell switchable privacy display technology". Chinese Journal of Liquid Crystals and Displays. Dec. 31, 2019 (Dec. 31, 2019). vol. 34, No. 12. pp. 1155-1160.

* cited by examiner

DISPLAY PANEL AND ELECTRONIC DEVICE

CROSS REFERENCE

This application is a National Stage Filing of the PCT International Application No. PCT/CN2020/109003 filed on Aug. 13, 2020, the entirety of which is herein incorporated by reference.

TECHNICAL FIELD

The present disclosure relates to the field of display, in particular to a display panel and an electronic device.

BACKGROUND

In the related art, in certain special occasions, in order to protect important information from being leaked, it is expected that when a display product is being used, display information on the screen can be read only at a front view angle, namely, the display information can be read only when the user is directly facing the screen, and when the screen is observed at a side view angle or a large view angle, the information cannot be read normally, so that the purpose of anti-peep is achieved, that is, information security is ensured in public places or other specific places. Therefore, anti-peep products (with picture distortion at a large view angle and information visible only at a front view angle) become one of important trends in future development.

At present, display products mainly achieve an anti-peep function by means of the following two methods. On one hand, products in the field of liquid crystal display usually achieve anti-peep at a large view angle by controlling the liquid crystal state. On the other hand, permanent anti-peep can be achieved through attaching of an optical film, but the products cannot switch between anti-peep and non-anti-peep, meanwhile, the thickness of the products may be increased, and the brightness of the products may be reduced. For self-luminous display products, the purpose that anti-peep is implemented under the condition that anti-peep is needed and normal display is implemented under the condition that anti-peep is not needed is difficult to realize at present, that is, a conventional display panel does not support a first mode and a normal display mode, and does not support the switching between the first mode and the normal display mode.

Therefore, how to make a self-luminous device have a first mode and a normal display mode is a problem that needs to be urgently solved.

SUMMARY

In view of the defects in the related art, embodiments of the present disclosure provide a display panel and an electronic device, which can solve the problem that a self-luminous device does not have a first mode and a normal display mode in the related art.

The embodiments of the present disclosure provide a display panel, which includes a driving array; first light-emitting devices electrically connected with the driving array; and second light-emitting devices located between at least two of the first light-emitting devices and electrically connected with the driving array. In a case where the first light-emitting devices are in a working state and the second light-emitting devices are in a first state, the display panel is in a first mode. In a case where the first light-emitting devices are in a working state and the second light-emitting devices are in a second state, the display panel is in a second mode. A visual angle of the display panel in the first mode is greater than 0 and smaller than a visual angle of the display panel in the second mode.

According to the display panel, the second light-emitting devices, electrically connected with the driving array, are additionally arranged in the display panel, and the driving array can control the working states of the first light-emitting devices and the second light-emitting devices to make the display panel work in the first mode (anti-peep mode) or the second mode, so that the switching of the display panel in different visual angle modes is realized. By virtue of the scheme, the display panel is supported to have the anti-peep mode and the normal display mode, and the problem that a display panel in the related art does not have the first mode and the normal display mode is solved.

In at least one exemplary implementation, the second light-emitting devices emit light with a greater intensity in the first state than in the second state.

In at least one exemplary implementation, the first state of the second light-emitting devices is an on state, and the second state of the second light-emitting devices is an off state. In this way, the user can view from any position (angle) without being affected by the second light-emitting devices when the second light-emitting devices are in the second state, and a better display effect of the display panel in the second mode can be achieved.

In at least one exemplary implementation, when the second light-emitting devices are in the first state, more than 90% of light emitted by the second light-emitting devices is emitted from side surfaces, wherein the side surfaces are surfaces, parallel to a thickness direction of the driving array, of the second light-emitting devices. In the first mode, most of the light emitted by the second light-emitting devices is emitted from the side surfaces of the second light-emitting devices. When the user observes a screen at a view angle beyond a preset angle range, human eyes will be affected by the light emitted from the side surfaces of the second light-emitting devices while collecting signals of a normal display picture, the display picture is distorted under the influence of the light emitted from the side surfaces of the second light-emitting devices, so that display information cannot be read, and the purpose of anti-peep can be achieved. When the user observes at a view angle smaller than or equal to the preset angle, due to the fact that very little light is emitted from the front surfaces of the second light-emitting devices, the user can normally read the display information without being influenced by the second light-emitting devices, and therefore, the normal reading of the display information by the user is further guaranteed.

In at least one exemplary implementation, each of the second light-emitting devices includes a light-emitting chip and a light blocking layer arranged on a surface, away from the driving array, of the light-emitting chip. In the first mode, the driving array controls the light-emitting chips to control the second light-emitting devices to be in the first state. In the second mode, the driving array controls the light-emitting chips to control the second light-emitting devices to be in the second state. The light blocking layers are configured to block light from being emitted from front surfaces of the second light-emitting devices, so as to further guarantee that most of light emitted by the second light-emitting devices is emitted from the side surfaces, and the user at the preset angle range can see clear content.

In at least one exemplary implementation, reflectivity or absorptivity of a material of the light blocking layer to light emitted by the light-emitting chip is greater than 95%, which further reduces the light emitted from the front surfaces of the second light-emitting devices, so that substantially all the light is emitted from the side surfaces.

In at least one exemplary implementation, the display panel includes pixel units located in a display region, each pixel unit at least includes multiple first light-emitting devices, and the multiple first light-emitting devices at least include a red light emitting device, a green light emitting device and a blue light emitting device.

In at least one exemplary implementation, there are multiple second light-emitting devices, and the multiple second light-emitting devices are arranged among at least part of the pixel units.

In at least one exemplary implementation, any one of the second light-emitting devices is located between two adjacent rows of pixel units and between two adjacent columns of pixel units. In this way, the second light-emitting devices is uniformly the distributed, which enables more light to be uniformly emitted during the operation of the second light-emitting devices, so that when the user observes the screen at a view angle beyond the preset angle range, the light emitted by the second light-emitting devices can further influence signals of the normal display picture, so that anti-peep effect is better achieved.

In at least one exemplary implementation, the driving array includes a thin film transistor, a first signal line, a second signal line and a third signal line, the first signal line is electrically connected to anodes of the second light-emitting devices, the second signal line is electrically connected to a source electrode of the thin film transistor, a drain electrode of the thin film transistor is electrically connected with anodes of the first light-emitting devices, the third signal line is electrically connected with cathodes of the first light-emitting devices and cathodes of the second light-emitting devices respectively. In this implementation, the first signal line is added, and the third signal line is in contact with the cathodes of the second light-emitting devices. The structure of the driving array is simple, the space of the driving array (back plate) is saved, and thus miniaturization development of the display panel is facilitated.

In at least one exemplary implementation, the first signal line and the second signal line are located on a surface of a dielectric layer of the thin film transistor. In this way, a manufacturing process of the driving array may be better compatible with an existing manufacturing process of the driving array, and a new process flow is substantially not required to be developed.

In at least one exemplary implementation, the driving array may further include a first electrode and a second electrode, the first signal line is electrically connected to the anodes of the second light-emitting devices through the first electrode, and the drain electrode of the thin film transistor is electrically connected to the anodes of the first light-emitting devices through the second electrode.

In at least one exemplary implementation, the display panel may further include a fourth signal line and a fifth signal line spaced apart from the driving array, the fourth signal line is electrically connected to anodes of the second light-emitting devices, and the fifth signal line is electrically connected to cathodes of the second light-emitting devices.

In at least one exemplary implementation, the second light-emitting devices include at least one of the following: white light emitting devices, green light emitting devices, red light emitting devices and blue light emitting devices.

Based on the same inventive concept, the embodiments of the present disclosure further provide an electronic device, which includes a display panel, and the display panel is any of the display panels described above.

Due to the fact that the electronic device includes the display panel, the electronic device is enabled to have a first mode and a second mode, and information security can be ensured in public places or specific places.

In at least one exemplary implementation, the electronic device may further include a control unit, configured to control the display panel to be in one of the first mode and the second mode.

DESCRIPTION OF REFERENCE NUMERALS

Figure 1:
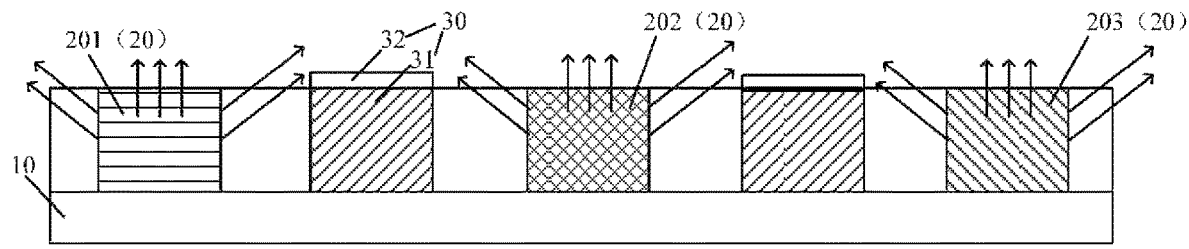
FIG. 1 is a schematic diagram of a structure and an optical path of a display panel in a second mode according to an embodiment of the present disclosure.

10, driving array; 11, thin film transistor; 12, first signal line; 13, second signal line; 14, third signal line; 15, flat layer; 16, first electrode; 17, second electrode; 110, first substrate; 111, buffer layer; 112, P-type silicon layer; 113, insulating layer; 114, dielectric layer; 115, source electrode; 116, gate electrode; 117, drain electrode; 20, first light-emitting device; 21, second substrate; 22, N-type layer; 23, quantum well; 24, P-type layer; 25, P-type bonding pad; 26, N-type bonding pad; 27, cathode; 28, anode; 30, second light-emitting device; 31, light-emitting chip; 32, light blocking layer; 01, eyes of a user; 200, pixel unit; 201, red light emitting device; 202, green light emitting device; and 203, blue light emitting device.

DETAILED DESCRIPTION OF THE EMBODIMENTS

In order to facilitate the understanding of the present disclosure, more complete description of the embodiments of the present disclosure will now be made with reference to the associated drawings. Exemplary implementations of the present disclosure are illustrated in the drawings. However, the present disclosure may be realized in many different forms and is not limited to the implementations described herein. Rather, the implementations are provided to facilitate a more thorough and complete understanding of the content of the present disclosure.

Unless defined otherwise, all technical and scientific terms used herein have the same meaning as commonly understood by those having ordinary skill in the art to which the present disclosure belongs. The terms used in the specification of the present disclosure herein is for the purpose of describing the exemplary implementations only and is not intended to be limiting of the present disclosure.

It is to be understood that when an element (such as a layer, film, region, or substrate) is described as being 'on' another element, the element may be directly on the other element, or an intervening element may also be present between this element and the other element. Moreover, in the specification and claims, when an element is described as being 'connected' to another element, the element may be 'directly connected' to the other element or 'connected' to the other element through a third element.

As described in the background, a display panel in the related art does not have an anti-peep mode and a normal display mode, and switching of the display panel between the two modes is not supported.

Based on this, the embodiments of the present disclosure provide a solution capable of solving the above technical problem, the details of which will be set forth in the following embodiments.

In an implementation of the present disclosure, a display panel is provided, as shown in FIGS. 1-5. The display panel includes a driving array 10, first light-emitting devices 20 and second light-emitting devices 30. The first light-emitting devices 20 are arranged on one side of the driving array 10 and are electrically connected with the driving array 10, and the second light-emitting devices 30 are located between at least two of the first light-emitting devices 20 and are electrically connected with the driving array 10. In a case where the first light-emitting devices 20 are in a working state and the second light-emitting devices 30 are in a first state, the display panel is in a first mode, and in a case where the first light-emitting devices 20 are in a working state and the second light-emitting devices 30 are in a second state, the display panel is in a second mode, wherein a visual angle of the display panel in the first mode is greater than 0 and smaller than a visual angle of the display panel in the second mode.

Figure 2:
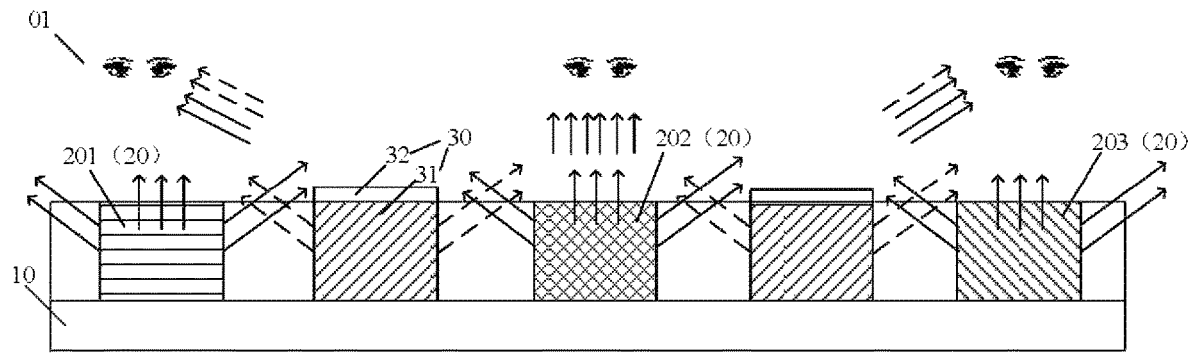
FIG. 2 is a schematic diagram of a structure and an optical path of a display panel (as shown in FIG. 1) in a first mode according to an embodiment of the present disclosure.

In a case where the driving array 10 controls the first light-emitting devices 20 and the second light-emitting devices 30 to work, the display panel is in the first mode. In a case where the driving array 10 controls the first light-emitting devices 20 to work and the second light-emitting devices 30 to not work, the display panel is in the second mode. When the display panel is in the first mode, the visual angle is equal to a preset angle, and the preset angle is greater than 0 degree and smaller than the visual angle in the second mode. In the first mode, a user in the preset angle range can see display information of the display panel, as shown in FIG. 2 (In FIG. 2, in order to distinguish light emitted by the first light-emitting devices 20 from light emitted by the second light-emitting devices 30, the light emitted before anti-peep is represented by dotted lines, and the light emitted by the first light-emitting devices 20 is represented by solid lines). A user observing at a position beyond the preset angle range (i.e., in a case where the preset angle is 100 degrees, a position with the angle smaller than 40 degrees on the right side of a normal line of a vertical plane and a position with the angle greater than 130 degrees on the left side of the normal line of the vertical plane) cannot see the display information of the display panel. In FIG. 2, light information received by eyes 01 of the user at the position with the angle greater than the preset angle includes both the light information emitted by the first light-emitting devices 20 and the light information emitted by the second light-emitting devices 30, so the user cannot normally see the corresponding display information. When the display panel is in the second mode, the visual angle is larger, so that the display panel is in the normal display mode, as shown in FIG. 1, the user observing at an angle in the larger visual angle range can see the display information of the display panel, and thus the normal display of the display panel is guaranteed.

According to the display panel, the second light-emitting devices 30, electrically connected with the driving array 10, are additionally arranged in the display panel, and the driving array 10 can control the working states of the first light-emitting devices 20 and the second light-emitting devices 30 to make the display panel work in the first mode (anti-peep mode) or the second mode, so that the switching of the display panel in different visual angle modes is realized. By virtue of the scheme, the display panel is supported to have the anti-peep mode and the normal display mode, and the problem that anti-peep display cannot be realized due to the fact that the display panel in the related art does not have the first mode and the normal display mode is solved.

It is to be noted that the display panel in the embodiments of the present disclosure is a display panel which can emit light to realize display without a backlight source. The display panel in the embodiments of the present disclosure may be an Organic Light-Emitting Diode (OLED) display panel, a Micro-led display panel, or a Mini-led display panel, and the specific type is not limited herein. The visual angle in the embodiments of the present disclosure refers to an angle at which the user can clearly view all content on the screen from different directions.

In addition, it is to be noted that the visual angle of the embodiments of the present disclosure includes at least one of a horizontal visual angle and a vertical visual angle, that is, the display panel of the embodiments of the present disclosure can realize horizontal anti-peep, or can realize vertical anti-peep, or can realize both horizontal and vertical anti-peep, which can specifically be set according to actual situations.

In the actual application process, the preset angle of the embodiments of the present disclosure may be determined according to the actual situations so as to adapt to different application scenarios. For example, the preset angle may be determined according to the size of the display panel and the like. As the visual angle includes at least one of the horizontal visual angle and the vertical visual angle, the corresponding preset angle also includes at least one of the horizontal preset angle and the vertical preset angle. Under the condition that the horizontal preset angle and the vertical preset angle need to be determined at the same time, the corresponding horizontal preset angle and vertical preset angle may be the same or different.

In order to meet the requirements of most display panels, in an exemplary embodiment of the present disclosure, the visual angle includes a horizontal visual angle which is greater than or equal to 90 degrees (namely, 45 degrees on each of the left and right of the vertical normal of the display panel), so that the user can normally read the information displayed by the display panel at a front view without being affected by light emitted by the second light-emitting devices 30. When the user observes the display panel at a large view angle (an angle smaller than 45 degrees on the right side or greater than 135 degrees on the left side, where the left and the right herein are the directions when facing the display panel), the user cannot read the information due to the influence from the light emitted by the peek prevention components, i.e., the second light-emitting devices 30.

In another exemplary embodiment of the present disclosure, the visual angle of the display panel in the second mode is the maximum visual angle of the display panel. In this way, it is further guaranteed that the second mode of the display panel is the normal display mode.

In the actual application process, through device design, the light emitting angle of the side surfaces of second light-emitting devices 30 can be controlled so as to adjust and control the visual angle of the display panel to adapt to different application scenarios. In an embodiment, an optimal anti-peep state is to allow the visibility only from the front view.

In an embodiment of the present disclosure, the intensity of light emitted by second light-emitting devices 30 in a first state is greater than the intensity of light emitted by the second light-emitting devices 30 in a second state. In other words, the second light-emitting devices 30 emit more light in the first state, and light information received by eyes 01 of a user at the position with the angle greater than a preset angle includes light emitted by first light-emitting devices 20 and a large amount of light emitted by the second light-emitting devices 30, so that the corresponding display information cannot be seen. The second light-emitting devices 30 emit less light in the first state, and thus a user can see the corresponding display information at the position with the angle greater than the preset angle without being substantially affected by the light emitted by the second light-emitting devices 30.

In another embodiment of the present disclosure, a first state of the second light-emitting devices 30 is an on state, namely, the first state of the second light-emitting devices 30 is actually a working state; and a second state of the second light-emitting devices 30 is an off state, namely, the second state of the second light-emitting devices 30 is a non-working state. In this way, the user can view from any position (angle) without being affected by the second light-emitting devices 30 when the second light-emitting devices 30 are in the second state, and a better display effect of the display panel in a second mode can be achieved.

In one exemplary embodiment of the present disclosure, as shown in FIG. 2, more than 90% of the light emitted by second light-emitting devices 30 is emitted from side surfaces, wherein the side surfaces are surfaces, parallel to a thickness direction of a driving array 10, of the second light-emitting devices 30. In the first mode, light-emitting chips 31 work and most of the light is emitted from the side surfaces of the second light-emitting devices 30, when a user observes a screen at a view angle beyond a preset angle range, human eyes will be affected by the light emitted from the side surfaces of the second light-emitting devices 30 while collecting signals of a normal display picture, the display picture is distorted under the influence of the light emitted from the side surfaces of the second light-emitting devices 30, so that display information cannot be read, and the purpose of anti-peep can be achieved. When the user observes at a view angle within the preset angle range, due to the fact that very little light is emitted from the front surfaces of the second light-emitting devices 30, the user can normally read the display information without being influenced by the second light-emitting devices 30, and therefore, the normal reading of the display information by the user is further guaranteed. In the second mode, the second light-emitting devices 30 do not work, so that the second light-emitting devices 30 do not emit light. When the user observes the screen at a view angle beyond the preset angle range, human eyes are not affected by interfering light while collecting the signals of the normal display picture, so that the user can normally read the information. When the user observes at the view angle within the preset angle range (including the preset angle), the user is not affected by the interfering light, and thus the user can normally read the information.

In order to simplify the structure of the second light-emitting devices 30, enable a manufacturing process of the second light-emitting devices 30 to be compatible with a manufacturing process of first light-emitting devices 20, and further simplify a manufacturing process of a display panel, in an embodiment of the present disclosure, as shown in FIGS. 1, 2, 5 and 6, each second light-emitting device 30 includes a light-emitting chip 31 and a light blocking layer 32, wherein the light blocking layer 32 is arranged on the surface, far away from the driving array 10, of the light-emitting chip 31, and the second light-emitting device 30 is arranged between the two first light-emitting devices 20. In the first mode, the driving array 10 controls the light-emitting chips 31 to control the second light-emitting devices 30 to be in the first state. In the second mode, the driving array 10 controls the light-emitting chip 31 to control the second light-emitting devices 30 to be in the second state. The light blocking layer 32 is configured to block light from being emitted from the front surface of the second light-emitting device 30, so as to further guarantee that most of light emitted by the second light-emitting devices 30 is emitted from side surfaces, and therefore, it is further guaranteed that a user in a preset angle range can see clear content.

Figure 5:
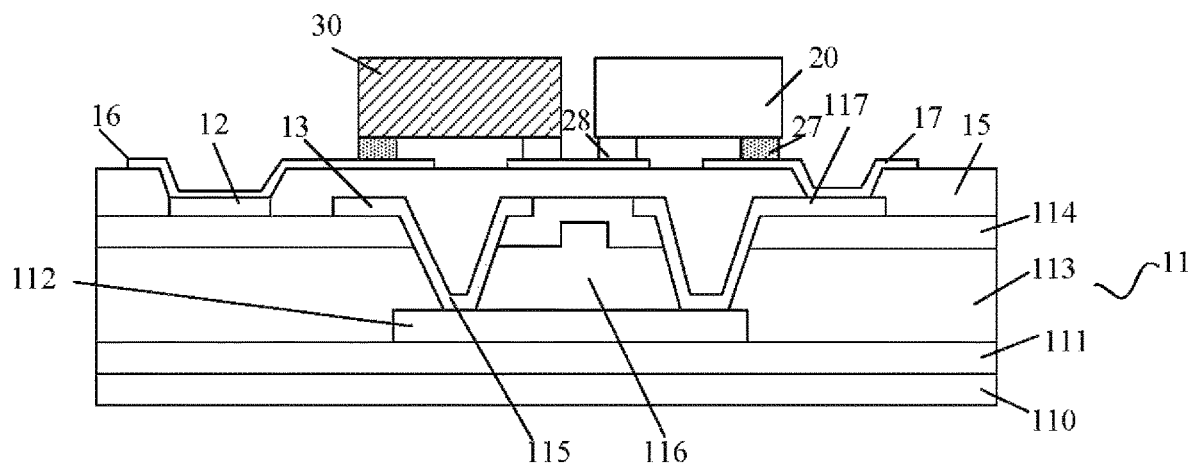
FIG. 5 a schematic diagram of a display panel according to yet another embodiment of the present disclosure.
Figure 6:
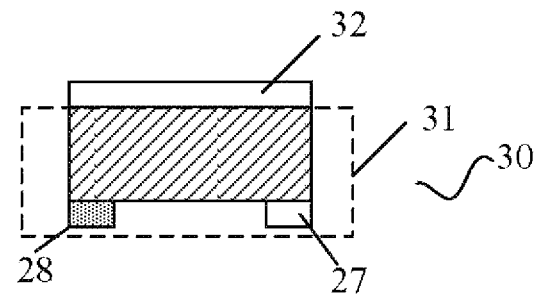
FIG. 6 is a schematic diagram of a second light-emitting device according to an embodiment of the present disclosure.
Figure 7:
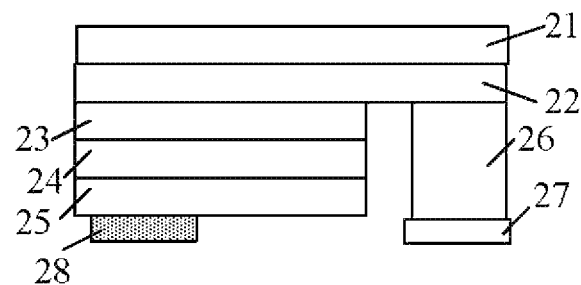
FIG. 7 is a structural diagram of at least one of a first light-emitting device and a second light-emitting device according to an embodiment of the present disclosure.

In an embodiment of the present disclosure, the first light-emitting devices 20 are inversely mounted on a surface of the driving array 10, that is, electrodes of the first light-emitting devices 20 are arranged in contact with the driving array 10, while the distance between a substrate (second substrate 21 in FIG. 7) in the first light-emitting devices 20 and the driving array 10 is the maximum, see FIG. 5 and FIG. 7. In the embodiment, the second light-emitting devices 30 are inversely mounted on the surface of the driving array 10, that is, electrodes of the second light-emitting devices 30 are arranged in contact with the driving array 10, while the distance between the substrate (second substrate 21 in FIG. 7) and the driving array 10 is the maximum.

In order to further ensure that light emitted from front surfaces of the second light-emitting devices 30 is reduced so that substantially all of the light is emitted from side surfaces, in an embodiment of the present disclosure, the reflectivity or absorptivity of a material of the light blocking layer 32 to light is greater than 95%. For example, the material of the light blocking layer 32 may be a carbon-doped oxygen-containing resin, metallic silver, or the like.

The material of the light blocking layer 32 of the embodiment of the present disclosure may be any suitable material in the related art, and those having ordinary skill in the art may select a suitable material to form the light blocking layer 32 of the embodiment of the present disclosure according to practical situations. In one exemplary embodiment of the present disclosure, the material of the light blocking layer 32 includes at least one of an organic material and a metal material.

In an exemplary embodiment, the material of the light blocking layer 32 is a black matrix material, such as a black resin doped with Cr, CrOx, or the like.

In the actual application process, there are multiple first light-emitting devices 20, and the multiple first light-emitting devices 20 may be light-emitting devices of the same color or light-emitting devices of different colors. Specifically, red light emitting devices 201, green light emitting devices 202 or blue light emitting devices 203 may be selected as the first light-emitting devices 20 according to actual needs.

In order to meet general display requirements and achieve color display, in an embodiment, a display panel includes pixel units 200 located in a display region, each pixel unit 200 at least includes multiple first light-emitting devices 20, and the multiple first light-emitting devices 20 at least include red light emitting devices 201, green light emitting devices 202 and blue light emitting devices 203. In the embodiment shown in FIG. 3 and FIG. 4, each pixel unit 200 includes three above-described first light-emitting devices 20, respectively a red light emitting device 201, a green light emitting device 202 and a blue light emitting device 203. In the embodiment, the display region also includes second light-emitting devices 30.

Figure 3:
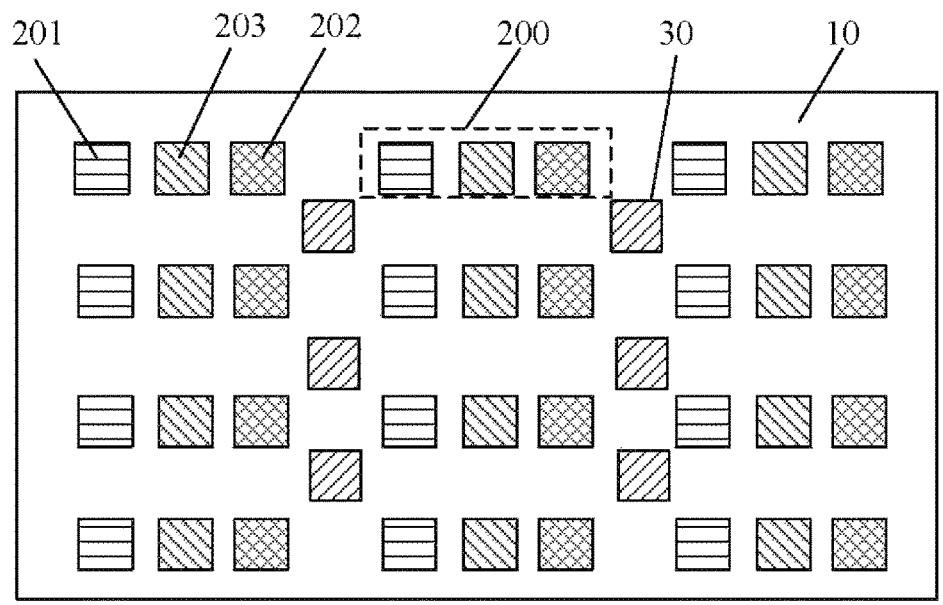
FIG. 3 is a schematic diagram of a partial structure of a display panel according to another embodiment of the present disclosure.
Figure 4:
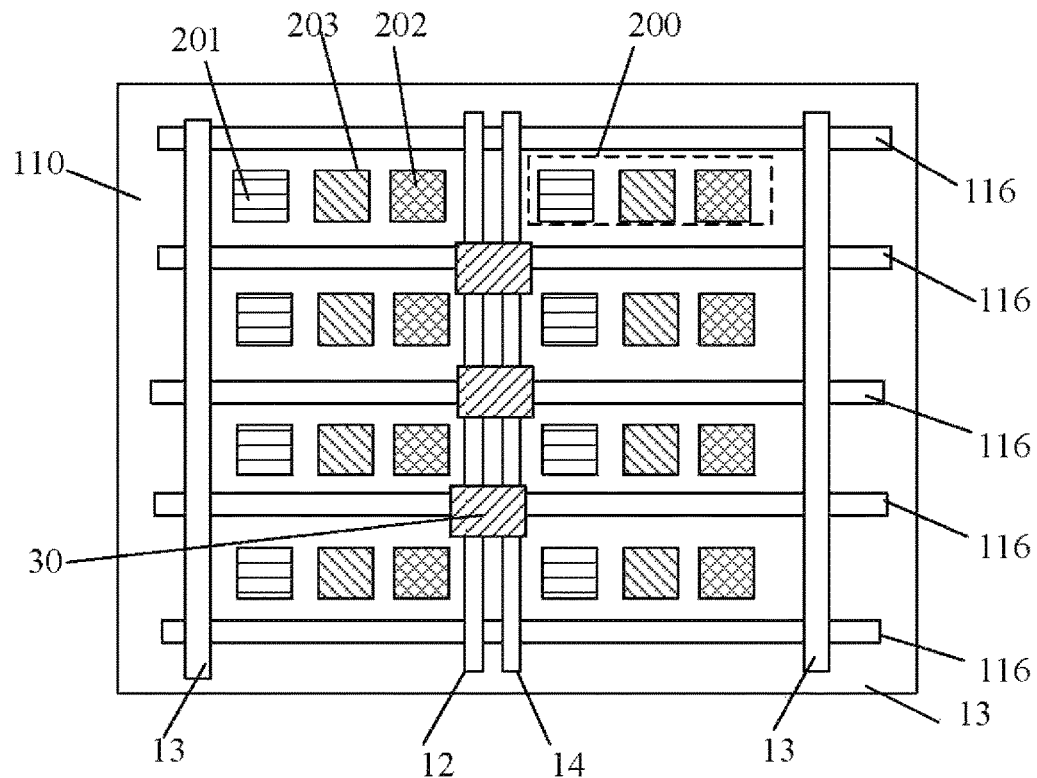
FIG. 4 a schematic diagram of a partial structure of a display panel according to still another embodiment of the present disclosure.

In another embodiment of the present disclosure, as shown in FIG. 3 and FIG. 4, there are multiple second light-emitting devices 30, so that more light can be emitted during working of the second light-emitting devices 30. Any one of the second light-emitting devices 30 is located between two adjacent rows of pixel units 200 and between two adjacent columns of pixel units 200, and the second light-emitting devices 30 are uniformly distributed, which enables more light to be uniformly emitted during the operation of the second light-emitting devices 30, so that when a user observes a screen at a view angle beyond a preset angle range, the light emitted by the second light-emitting devices 30 can further influence signals of a normal display picture, so that anti-peep effect is better achieved.

The first light-emitting devices 20 of the embodiments of the present disclosure may be any suitable light-emitting devices in the related art, and those having ordinary skill in the art may select the suitable first light-emitting devices 20 according to practical situations.

In an exemplary embodiment of the present disclosure, the first light-emitting devices 20 are one of LEDs, OLEDs, Micro-leds or Mini-leds. The light-emitting devices are self-luminous devices and are in pure solid display, so that the visual angle of the display panel is larger and may reach about 170 degrees.

Similarly, the second light-emitting devices 30 of the present disclosure may be any suitable light-emitting devices in the related art, and those having ordinary skill in the art may select the suitable second light-emitting devices 30 according to practical situations. In an exemplary embodiment, second light-emitting devices 30 are one of LEDs, OLEDs, Micro-leds or Mini-leds. In an exemplary embodiment, the first light-emitting devices 20 and the second light-emitting devices 30 are the same light-emitting devices, so that manufacturing processes of the first light-emitting devices 20 and the second light-emitting devices 30 are compatible, and the manufacturing process of a display panel is simplified.

In an exemplary embodiment of the present disclosure, at least one of a first light-emitting device 20 and a second light-emitting device 30 is as shown in FIG. 7. Each light-emitting device includes a second substrate 21, an N-type layer 22, a quantum well 23, a P-type layer 24, and a P-type bonding pad 25 which are arranged in sequence, and further includes an N-type bonding pad 26, a cathode 27 and an anode 28. The N-type bonding pad 26 is located on the surface, away from the substrate, of the N-type layer 22, the cathode 27 is located on the surface, away from the N-type layer 22, of the N-type bonding pad 26, and the anode 28 is located on the surface, away from the P-type layer 24, of the P-type bonding pad 25. In an exemplary embodiment, both the N-type layer 22 and the P-type layer 24 are GaN layers.

Since the light-emitting chip 31 in the second light-emitting device 30 in the embodiments of the present disclosure only needs to emit interfering light to achieve an anti-peep function, and does not need to display specific contents, therefore, the second light-emitting devices 30 at least include one of the following: white light emitting devices, green light emitting devices, red light emitting devices or blue light emitting devices. Those having ordinary skill in the art may select the suitable light-emitting devices according to practical situations.

In practical applications, the driving array 10 of the embodiments of the present disclosure may be any suitable driving array 10, for example, a driving array 10 arranged on a PCB, a driving array 10 arranged on a glass substrate, or a driving array 10 arranged on a flexible substrate. The type of the substrate carrying the driving array 10 is not limited herein. It should be understood that the type of the display panel of the embodiments of the present disclosure may be rigid or flexible, transparent or opaque, which is not limited herein. Those having ordinary skill in the art may design a suitable driving array 10 to control the working of the first light-emitting devices 20 and the second light-emitting devices 30 according to practical situations.

In an exemplary embodiment of the present disclosure, as shown in FIG. 4 and FIG. 5, the driving array 10 includes a thin film transistor 11, a first signal line 12, a second signal line 13 and a third signal line 14. The first signal line 12 is electrically connected to anodes 28 of second light-emitting devices 30, the second signal line 13 is electrically connected to a source electrode 115 of the thin film transistor 11, a drain electrode 117 of the thin film transistor 11 is electrically connected to anodes 28 of first light-emitting devices 20, and the third signal line 14 is electrically connected to cathodes 27 of the first light-emitting devices 20 and cathodes 27 of the second light-emitting devices 30, that is, the first light-emitting devices 20 and the second light-emitting devices 30 share the cathodes 27. In this way, by controlling voltages of the first signal line 12 and the third signal line 14, the voltage difference between the cathodes 27 and the anodes 28 of the second light-emitting devices 30 can be controlled, so that the second light-emitting devices 30 can be controlled to work or not work. By controlling voltages of the second signal line 13 and the third signal line 14, the first light-emitting devices 20 may be controlled to work or not work. By controlling whether the first light-emitting devices 20 work or not and controlling whether the second light-emitting devices 30 work or not, the display panel may be controlled to be in a first mode or a second mode, namely, whether the first mode is activated or not is controlled. In the embodiment, compared with the driving array 10 in the related art, the first signal line 12 is added, the third signal line 14 is in contact with the cathodes 27 of the second light-emitting devices 30, so that the driving array 10 is relatively simple in structure, the space of a back plate is saved, and the miniaturization development of the display panel is facilitated.

Of course, in practical applications, the cathodes 27 of the second light-emitting devices 30 and the cathodes 27 of the first light-emitting devices 20 may also not be the same cathodes. In another embodiment of the present disclosure, which is not shown in the figure, the display panel may further include a fourth signal line and a fifth signal line which are spaced apart from the driving array 10, the fourth signal line is electrically connected with the anodes 28 of the second light-emitting devices 30, the fifth signal line is electrically connected with the cathodes 27 of the second light-emitting devices 30, namely, the cathodes 27 of the second light-emitting devices 30 and the cathodes 27 of first light-emitting devices 20 are respectively provided with a signal line, and the working states of the second light-emitting devices 30 and the first light-emitting devices 20 are controlled by controlling the corresponding signal lines.

Since the second light-emitting devices 30 are only used as an anti-peep function and do not participate in normal display, the second light-emitting devices 30 are designed as Passive Matrix (PM) drive. Of course, the second light-emitting devices 30 are not limited to adopt the PM drive, and other driving manners, such as an active driving manner, are also possible.

Figure 8:
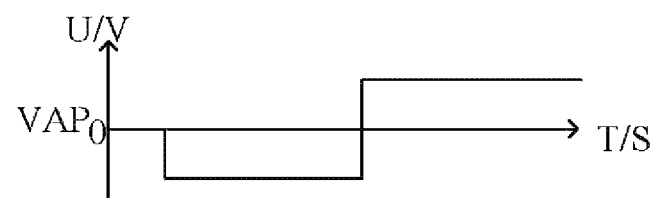
FIG. 8(a) is a schematic diagram of an anti-peep signal over time according to an embodiment of the present disclosure.
FIG. 8(b) is a schematic diagram of a third signal line VSS over time according to an embodiment of the present disclosure.
Figure 8:
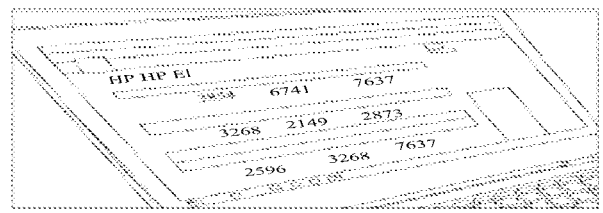

FIG. 8(*a*) and FIG. 8(*b*) are waveform diagrams of anti-peep signals VAP of the first signal line 12 and signals VSS of the third signal line 14, respectively. The VSS is shared with a normal signal of the display panel and is a constant negative voltage signal. When anti-peep is not needed, VAP is consistent with VSS, the second light-emitting devices 30 do not work, and the light leakage phenomenon (noise reduction effect) caused by the voltage coupling effect can be prevented. When the first mode needs to be activated, VAP is switched from a low level to a high level, the anti-peep components, namely the second light-emitting devices 30, emit light due to flowing of current under the action of the voltage, then an anti-peep function at large view angle is achieved. The magnitude of the high-level voltage of the anti-peep signal may be adjusted according to the actual anti-peep effect.

In specific applications, for simplicity of structure and ease of manufacturing, as shown in FIG. 5, in an embodiment of the present disclosure, the driving array 10 may further include a first electrode 16 and a second electrode 17, the first signal line 12 is electrically connected to the anodes 28 of the second light-emitting devices 30 through the first electrode 16, and a drain electrode 117 of a thin film transistor 11 is electrically connected to the anodes 28 of the first light-emitting devices 20 through the second electrode 17.

In yet another embodiment of the present disclosure, the first signal line 12 and the second signal line 13 are located on the surface of a dielectric layer 114 of the thin film transistor 11, for example, as shown in FIG. 5, the first signal line 12 and the second signal line 13 are located on an upper surface of the dielectric layer 114 (that is, on the surface away from an insulating layer 113). In this way, a manufacturing process of the driving array 10 may be better compatible with an existing manufacturing process of the driving array 10, and a new process flow is basically not required to be developed.

In order to better protect the structure of the thin film transistor 11 and ensure that the display panel has a long service life, in an embodiment of the present disclosure, as shown in FIG. 5, the driving array 10 may further include a flat layer 15. The flat layer 15 is located on the side, away from an insulating layer 113, of a dielectric layer 114. The flat layer 15 is provided with two through holes, respectively a first through hole and a second through hole, at least part of the first electrodes 16 is located in the first through hole so as to be in contact with the first signal line 12, and at least part of the second electrodes 17 is located in the second through hole so as to be in contact with a drain electrode 117 of the thin film transistor 11.

An exemplary structure of the thin film transistor 11 is also shown in FIG. 5. The exemplary structure of the thin film transistor 11 includes a first substrate 110, a buffer layer 111, a P-type silicon layer 112, an insulating layer 113 and the like, and the specific position relation between the components is shown in FIG. 5. The gate electrode 116 in FIG. 5 is a scanning line, specifically refer to FIG. 4. Of course, the thin film transistor 11 of the embodiment of the present disclosure is not limited to the structure shown in FIG. 5, and may be of any other structure.

In still another embodiment which is not shown in the figure, the display panel may further include a driving chip (driving IC), the driving chip is electrically connected with the first signal line 12, the second signal line 13, the third signal line 14 and the grid electrode 116 of the thin film transistor 11 respectively, specifically, the driving chip may be connected to the display panel through a metal wire of the driving array 10. The driving chip is configured to control the voltage of the first signal line 12, the voltage of the second signal line 13, the voltage of the third signal line 14, and the voltage of the gate electrode 116 to control the working of first light-emitting devices 20 and second light-emitting devices 30, and therefore, the display panel is controlled to be in a first mode or a second mode.

In another typical implementation of the present disclosure, an electronic device is provided, which includes a display panel, and the display panel is any one of the display panels described above.

Due to the fact that the electronic device includes the display panel, the electronic device is enabled to have a first mode and a second mode, and information security can be ensured in public places or specific places.

In still another embodiment of the present disclosure, the electronic device may further include a control unit, configured to control the display panel to be in one of the first mode and the second mode. Specifically, the control unit is electrically connected with the driving chip of the display panel, and the working of first light-emitting devices 20 and second light-emitting devices 30 is controlled by controlling the working of the driving chip. In the exemplary implementation process, the electronic device may further include a control structure, after the control structure receives a preset operation, and the control unit controls the driving chip to work according to information corresponding to the preset operation. For example, the control structure may be a control key, and the first mode may be activated and deactivated through a pressing on the control key.

The electronic device of the embodiment of the present disclosure may be any device including a display panel, for example, a computer, a mobile phone or a tablet personal computer.

Figure 9:
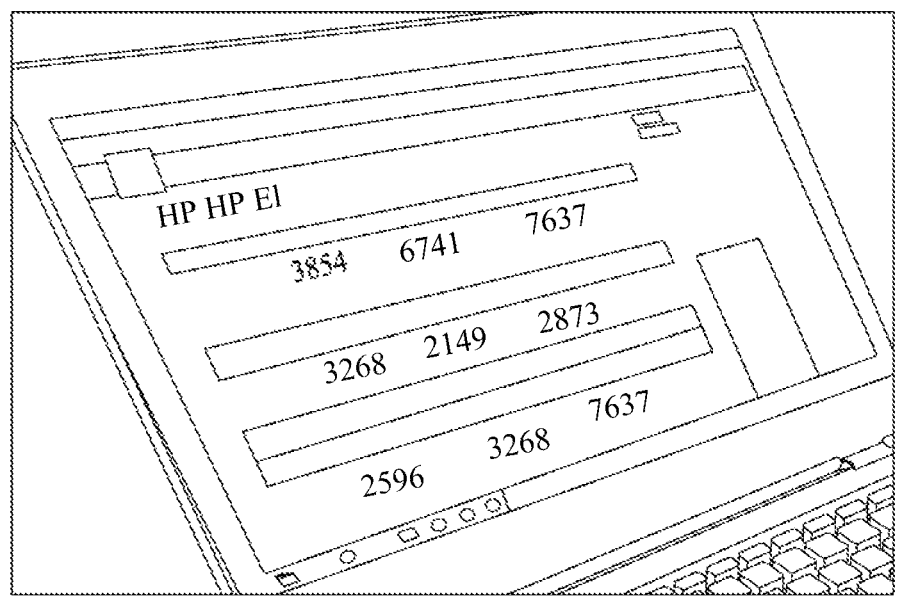
FIG. 9 is a schematic diagram illustrating the view when observing a display panel in a second mode at a large view angle according to an embodiment of the present disclosure.
Figure 10:
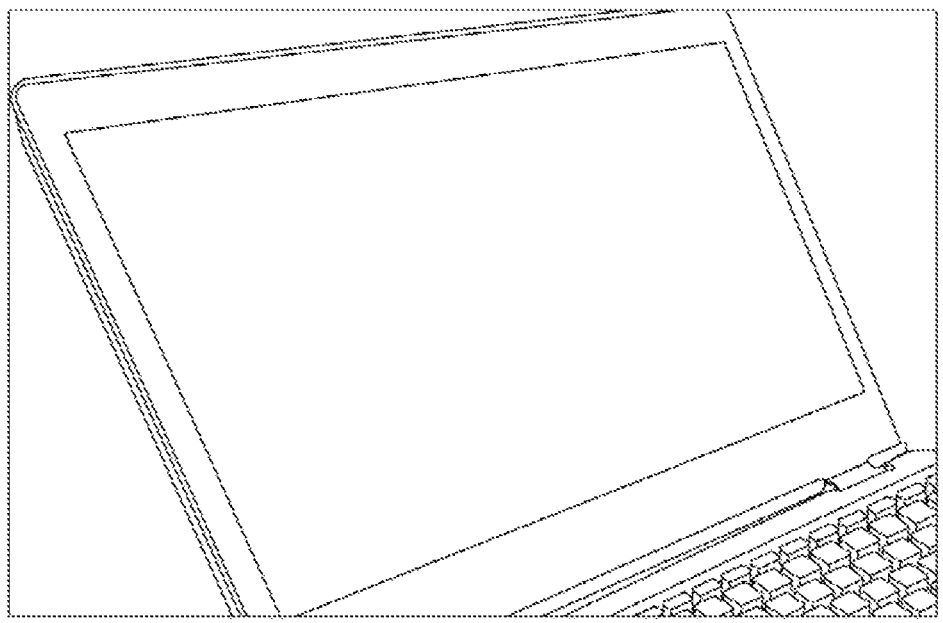
FIG. 10 is a schematic diagram illustrating the view when observing a display panel in a first mode at a large view angle according to an embodiment of the present disclosure.

FIG. 9 shows the content observed from a display panel of a notebook computer in a second mode from a large view angle. As shown in the figure, the picture information can be normally read from the large view angle, and a small square in the figure represents the displayed content. FIG. 10 shows the content observed from a display panel of a notebook computer in a first mode from a large view angle. As shown in the figure, due to interfering light emitted from the second light-emitting devices 30, the large-view-angle picture is distorted, so that display signals cannot be read normally, that is, no information is seen.

It is to be understood that the application of the embodiments of the present disclosure is not limited to the examples described above, and modifications or variations may be made in light of the above description by those having ordinary skill in the art, all of which are intended to fall within the scope of the appended claims.

What is claimed is:

1. A display panel, comprising:
    a driving array;
    first light-emitting devices electrically connected with the driving array; and
    second light-emitting devices located between at least two of the first light-emitting devices and electrically connected with the driving array, wherein in a case where the first light-emitting devices are in a working state and the second light-emitting devices are in a first state, the display panel is in a first mode; and in a case where the first light-emitting devices are in a working state and the second light-emitting devices are in a second state, the display panel is in a second mode, wherein a visual angle of the display panel in the first mode is greater than 0 and smaller than a visual angle of the display panel in the second mode, and when the second light-emitting devices are in the first state, more than 90% of light emitted by the second light-emitting devices is emitted from side surfaces, wherein the side surfaces are surfaces, parallel to a thickness direction of the driving array, of the second light-emitting devices.

2. The display panel according to claim 1, wherein the second light-emitting devices emit light with a greater intensity in the first state than in the second state.

3. The display panel according to claim 1, wherein the first state of the second light-emitting devices is an on state, and the second state of the second light-emitting devices is an off state.

4. The display panel according to claim 1 wherein each of the second light-emitting devices comprises a light-emitting chip and a light blocking layer arranged on a surface, away from the driving array, of the light-emitting chip.

5. The display panel according to claim 4, wherein reflectivity or absorptivity of a material of the light blocking layer to light emitted by the light-emitting chip is greater than 95%.

6. The display panel according to claim 1, wherein the display panel comprises pixel units located in a display region, each pixel unit comprises multiple first light-emitting devices, and the multiple first light-emitting devices at least comprise a red light emitting device, a green light emitting device and a blue light emitting device.

7. The display panel according to claim 6, wherein there are multiple second light-emitting devices, and the multiple second light-emitting devices are arranged among at least part of the pixel units.

8. The display panel according to claim 7, wherein any one of the second light-emitting devices is located between two adjacent rows of pixel units and between two adjacent columns of pixel units.

9. The display panel according to claim 1, wherein the driving array comprises a thin film transistor, a first signal line, a second signal line and a third signal line, the first signal line is electrically connected to anodes of the second light-emitting devices, the second signal line is electrically connected to a source electrode of the thin film transistor, a drain electrode of the thin film transistor is electrically connected with anodes of the first light-emitting devices, and the third signal line is electrically connected with cathodes of the first light-emitting devices and cathodes of the second light-emitting devices respectively.

10. The display panel according to claim 9, wherein the first signal line and the second signal line are located on a surface of a dielectric layer of the thin film transistor.

11. The display panel according to claim 9, wherein the driving array further comprises a first electrode and a second electrode, the first signal line is electrically connected to the anodes of the second light-emitting devices through the first electrode, and the drain electrode of the thin film transistor is electrically connected to the anodes of the first light-emitting devices through the second electrode.

12. The display panel according to claim 1, wherein the display panel further comprises a fourth signal line and a fifth signal line spaced apart from the driving array, the fourth signal line is electrically connected to anodes of the second light-emitting devices, and the fifth signal line is electrically connected to cathodes of the second light-emitting devices.

13. The display panel according to claim 1, wherein the second light-emitting devices at least comprise one of the following: white light emitting devices, green light emitting devices, red light emitting devices and blue light emitting devices.

14. An electronic device, comprising a display panel, wherein the display panel comprises:
    a driving array;
    first light-emitting devices electrically connected with the driving array; and
    second light-emitting devices located between at least two of the first light-emitting devices and electrically connected with the driving array, wherein in a case where the first light-emitting devices are in a working state and the second light-emitting devices are in a first state, the display panel is in a first mode; and in a case where the first light-emitting devices are in a working state and the second light-emitting devices are in a second state, the display panel is in a second mode, wherein a visual angle of the display panel in the first mode is greater than 0 and smaller than a visual angle of the display panel in the second mode, and when the second light-emitting devices are in the first state, more than 90% of light emiited by the second light-emitting devices is emitted from side surfaces, wherein the side surfaces are surfaces, parallel to a thickness direction of the driving array, of the second light-emitting devices.

15. The electronic device according to claim 14, further comprising:
    a control unit, configured to control the display panel to be in one of the first mode and the second mode.

16. The electronic device according to claim 14, wherein the second light-emitting devices emit light with a greater intensity in the first state than in the second state; or, the first state of the second light-emitting devices is an on state, and the second state of the second light-emitting devices is an off state.

17. The electronic device according to claim 14, wherein each of the second light-emitting devices comprises a light-emitting chip and a light blocking layer arranged on a surface, away from the driving array, of the light-emitting chip.

18. The electronic device according to claim 17, wherein reflectivity or absorptivity of a material of the light blocking layer to light emitted by the light-emitting chip is greater than 95%.

* * * * *